United States Patent
Ebermann

(10) Patent No.: US 7,254,022 B2
(45) Date of Patent: Aug. 7, 2007

(54) COOLING SYSTEM FOR EQUIPMENT AND NETWORK CABINETS AND METHOD FOR COOLING EQUIPMENT AND NETWORK CABINETS

(75) Inventor: Heiko Ebermann, Dresden (DE)

(73) Assignee: Knuerr AG, Arnstorf (DE)

( * ) Notice: Subject to any disclaimer, the term of this patent is extended or adjusted under 35 U.S.C. 154(b) by 361 days.

(21) Appl. No.: 10/495,429

(22) PCT Filed: May 6, 2004

(86) PCT No.: PCT/EP2004/004854

§ 371 (c)(1), (2), (4) Date: Feb. 1, 2005

(87) PCT Pub. No.: WO2005/104642

PCT Pub. Date: Nov. 3, 2005

(65) Prior Publication Data

US 2005/0237714 A1 Oct. 27, 2005

(30) Foreign Application Priority Data

Apr. 26, 2004 (DE) ................ 20 2004 006 552 U

(51) Int. Cl.
*H05K 7/20* (2006.01)
(52) U.S. Cl. .................. 361/696; 361/695; 454/184
(58) Field of Classification Search ............... 361/687, 361/694–695, 701, 696; 454/184
See application file for complete search history.

(56) References Cited

U.S. PATENT DOCUMENTS

| | | | |
|---|---|---|---|
| 3,648,113 A | | 3/1972 | Rathjen et al. |
| 3,749,981 A | * | 7/1973 | Koltuniak et al. .......... 361/696 |
| 4,535,386 A | * | 8/1985 | Frey et al. .................. 361/714 |
| 5,150,277 A | * | 9/1992 | Bainbridge et al. ......... 361/695 |
| 5,467,250 A | * | 11/1995 | Howard et al. ............. 361/696 |
| 5,544,012 A | * | 8/1996 | Koike ........................ 361/695 |
| 6,164,369 A | * | 12/2000 | Stoller ................... 165/104.33 |
| 6,198,628 B1 | * | 3/2001 | Smith ........................ 361/695 |

(Continued)

FOREIGN PATENT DOCUMENTS

DE  21 52 541 A1  8/1972

(Continued)

OTHER PUBLICATIONS

"Electronic Systems Order Information System," Knürr AG Catalog, Cover and back pages and pp. 252-254, Jul. 2002.

*Primary Examiner*—Greg Thompson
(74) *Attorney, Agent, or Firm*—Jacobson Holman PLLC

(57) ABSTRACT

The invention relates to a cooling system for equipment and network cabinets and to a method for cooling such cabinets, together with the electronic modules located therein.

Figure 1:
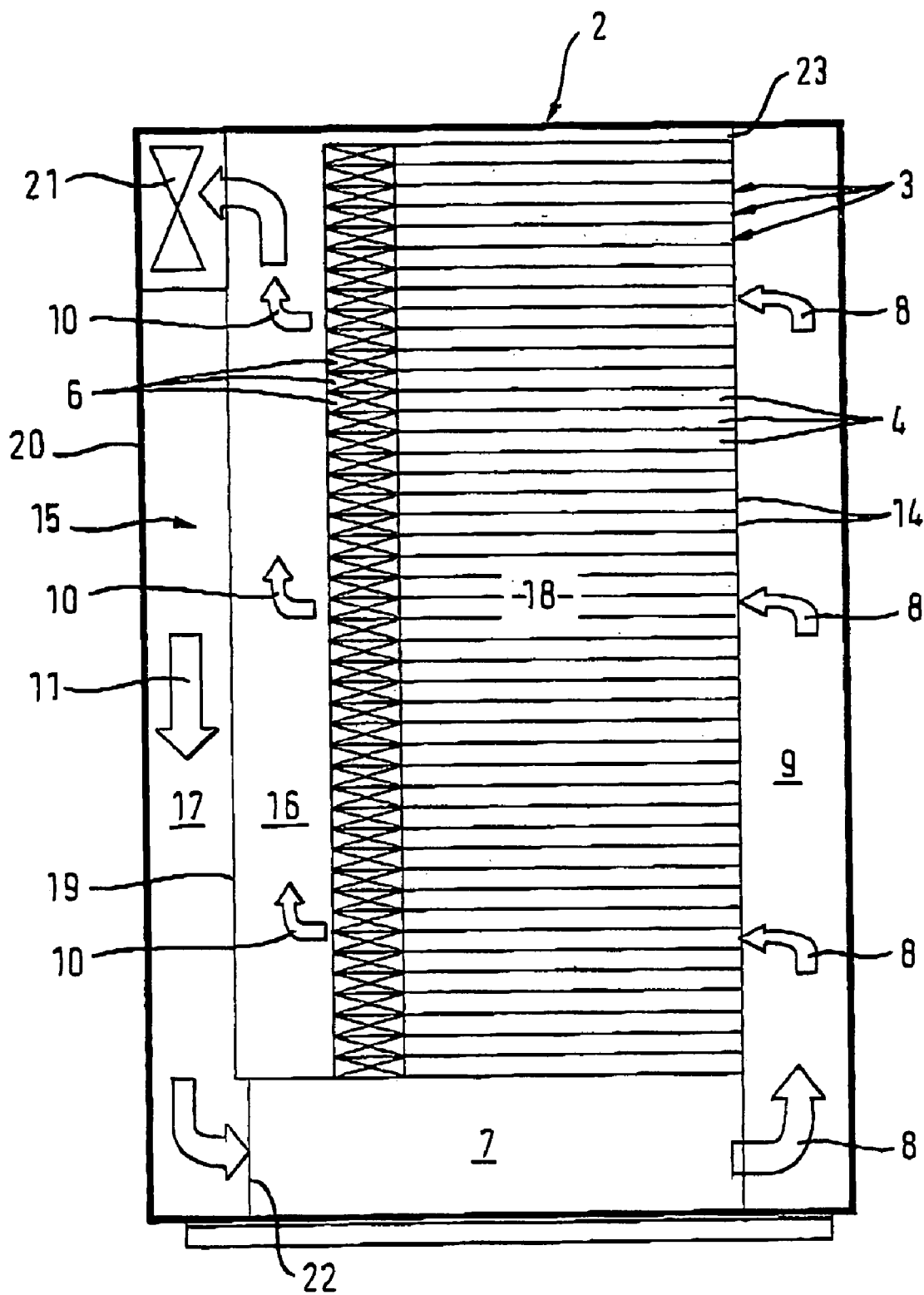

In order to achieve with extremely simple means and particularly low capital and operating expenditure a high power cooling for densely packed cabinets and cabinet arrangements, particularly server cabinets in data processing centers and the like, an air ducting is provided in a substantially airtight cabinet with equally long airflow paths and therefore equal flow resistances, together with a uniform supply air temperature. The circulated airflow is cooled with the aid of an air-water heat exchanger in the lower cabinet area. The heated exhaust air is collected in a collecting duct with a rising flow, reversed and supplied in a falling flow to the heat exchanger.

20 Claims, 2 Drawing Sheets

U.S. PATENT DOCUMENTS

| | | |
|---|---|---|
| 6,506,111 B2 | 1/2003 | Sharp et al. |
| 6,611,428 B1 * | 8/2003 | Wong .......................... 361/695 |
| 6,652,373 B2 * | 11/2003 | Sharp et al. ................ 454/184 |
| 6,652,374 B2 | 11/2003 | Sharp et al. |
| 6,742,583 B2 * | 6/2004 | Tikka ......................... 165/291 |
| 6,777,551 B2 * | 8/2004 | Nowakowski et al. ...... 544/184 |
| 6,819,563 B1 * | 11/2004 | Chu et al. .................... 361/696 |
| 6,889,752 B2 * | 5/2005 | Stoller ......................... 165/47 |
| 7,051,802 B2 * | 5/2006 | Baer ........................... 165/299 |
| 7,178,354 B2 * | 2/2007 | Bretschneider et al. .... 62/259.1 |
| 2001/0029163 A1 | 10/2001 | Spinazzola |
| 2003/0150231 A1 | 8/2003 | Spinazzola |
| 2005/0217299 A1 * | 10/2005 | Chu et al. .................. 62/259.2 |
| 2005/0225936 A1 * | 10/2005 | Day ........................... 361/687 |

FOREIGN PATENT DOCUMENTS

| | | |
|---|---|---|
| DE | 25 37 295 A1 | 4/1976 |
| DE | 101 28 367 A1 | 1/2003 |
| DE | 102 10 417 A1 | 10/2003 |
| WO | WO 03/005791 | 1/2003 |

* cited by examiner

COOLING SYSTEM FOR EQUIPMENT AND NETWORK CABINETS AND METHOD FOR COOLING EQUIPMENT AND NETWORK CABINETS

This is a nationalization of PCT/EP04/04854 filed May 6, 2004.

The invention relates to a cooling system for equipment and network cabinets, particularly server cabinets, according to the preamble of claim 1 and to a method for cooling equipment and network cabinets according to the preamble of claim 18.

The ever rising power levels of process computers and servers are linked with constantly rising heat losses. Thus, there are significant power losses in the case of high power processors and servers, particularly compact designs of e.g. one height unit (1 HU=1,75 inch), such as pizzabox and blade servers. The dissipation of the heat quantities released, particularly in the case of data processing centres, which generally have a relatively large number of server cabinets in one room, is associated with continuously rising capital and operating expenditure for the air conditioning of the room and the cooling of the cabinets and the electronic equipment located therein.

Said electronic equipment, e.g. servers, CPUs and the like, are frequently housed in modular form in a standardized enclosure and are generally installed in superimposed manner, but also in juxtaposed manner in an equipment or network cabinet on correspondingly positioned vertical beams. In order to dissipate the heat produced, said electronic modular units are equipped with at least one fan, as well as air inlet and outlet ports, which can be positioned in the side walls or in the front and back of the enclosure.

Cooling surfaces for air cooling cannot be provided, more particularly in compact server designs. In addition, the air conditioning systems of air conditioned rooms for arrangements of cabinets, which are provided with tightly packed modular units and which can have heating loads of 10 kW and higher per cabinet, are no longer sufficient to absorb the heat flow.

Generally air-cooled server cabinets are provided with perforated doors in order to bring about a maximum air permeability. For cooling closed inner spaces of equipment cabinets, it is also known to use air-water heat exchangers (knurr catalogue "Electronic Systems", July 2002, pp 252 to 254). The known air-water heat exchangers can be fitted to the cabinet cover or to an outer area of a side wall or a rear door or can be provided in slide-in module form, and the cabinet interior temperature can be cooled to below ambient temperature.

A disadvantage is the taking up of the inside space, which is consequently no longer available for equipping with modules. When the air-water heat exchangers are positioned on a side wall, a stringing together of cabinets and a rational utilization of the available installation space are limited. Positioning on the cabinet cover can, in the case of a water outflow, lead to damage to the electronic modules and the like. In addition, it is not always possible to ensure a uniform cooling of the modules as a result of the air ducting.

U.S. Pat. Nos. 6,506,111 B2, 6,652,373 B2, WO 03/005791 A2 and U.S. Pat. No. 6,652,374 B2 disclose server cabinets for superimposed servers, whose heat loss is dissipated by a recycled airflow. An exhaust airflow heated by the servers is supplied with the aid of a ventilator arrangement to a downstream air-water heat exchanger, which is positioned below the cabinet in a base or within the cabinet below the server stack arrangement and passes in the form of cooled supply air, via a supply air duct, to the servers.

An improvement of the heat dissipation is to be brought about by at least one air distributing device, which is located more particularly in the supply air duct, but can also be provided in the exhaust air duct or in both the supply and exhaust air ducts. The air distributing device is intended to ensure that a predeterminable airflow proportion can be supplied to the individual servers. Essentially it is a plate, which extends over the server stack arrangement and is provided with air passage openings, which are formed in horizontal rows in complimentary manner to the gaps between the servers. In order to supply a virtually identical air quantity to all the servers over the cabinet height, close to the cabinet base or the heat exchanger the air distributing plate has few or no air passage openings and in an upper area has several rows of air passage openings placed over the entire width.

In an alternative construction, a virtually identical air supply to the servers is to be obtained by means of an air distributing plate, which is arranged in inclined manner in the supply air duct, so that the cross-section of the latter decreases upwards. The air distributor plate is more particularly fixed to the front door of the cabinet and the inclined position can be varied with the aid of a hinge at the lower end and fastening clips with elongated holes at the upper end.

The known heat dissipation system requires additional costs for design, manufacture and installation of the at least one air distributing device. In addition, the sought homogeneous air supply and uniform heat dissipation cannot be guaranteed to the necessary extent as a result of the air ducting.

The object of the invention is to provide a cooling system for equipment and network cabinets, particularly server cabinets, and a method for cooling such cabinets and the modules located therein, particularly servers, which with the necessary certainty is able to ensure the necessary cooling capacity for tightly packed cabinets and cabinet arrangements, particularly for high power servers, using extremely simple means and involving particularly low capital and operating expenditure.

With reference to the cooling system, the object according to the invention is achieved by the features of claim 1 and with respect to the cooling method by the features of claim 18. Appropriate and advantageous developments appear in the subclaims and specific technical description.

The cooling system according to the invention is based on a closed cooling air circuit in a substantially airtight network or equipment cabinet and an air-water heat exchanger allowing the dissipation of all the power loss. The air-water heat exchanger is placed in a lower area of the cabinet and is advantageously connected to the cold water supply of the building.

According to a fundamental principle of the invention, the cooling system has an air ducting with equally long airflow paths and therefore identical flow resistances for the individual electronic modules in the interior of the cabinet (Tichlmann principle). Therefore the superimposed and/or juxtaposed, individual modules can be supplied with supply air at a uniform temperature.

The uniform supply air temperature is preferably assisted by a correspondingly high flow rate. The term uniform supply air temperature is understood to mean a temperature of approximately ñ2ø Kelvin.

According to the invention there is an air separation between the cold supply air and the heated exhaust air.

The in principle airtight network cabinet can e.g. be virtually completely sealed with respect to the environment and is able to satisfy an IP protection value of e.g. 55, i.e. can be constructed in dust and spray water-tight manner. As a result of the sealing provided, it is possible to prevent an air exchange between the substantially sealed cabinet interior and the installation space, where generally several such cabinets are installed and consequently the demands with respect to air conditioning leading to significant costs are obviated.

The supply air is cold or cooled air from the air-water heat exchanger in the lower area of the cabinet. This supply air is supplied by means of a supply air duct of the cabinet and which can extend over the entire cabinet height, but which is at least constructed in the vicinity of the modules, to the said modules and the gaps between the modules.

The module enclosures are appropriately provided with air inlet ports, which are connected to the supply air duct. The cooled supply air passes through the air inlet ports into the modules, is heated by the heat loss absorbed and passes via air outlet ports, which are preferably formed in an enclosure wall parallel to the air inlet ports, to an exhaust air duct.

The modules can contain at least one fan, which e.g. sucks in the cold supply air and feeds it through the air outlet port into the exhaust air duct. However, even without fans, the air ducting according to the invention ensures a uniform cooling of the modules. Thus, the cooling system according to the invention has the advantage that the modules can be cooled to the necessary extent without fans.

The exhaust air duct is constructed in split manner for implementing the equal length airflow paths for all the modules and identical air resistances and has a first duct section and a second, following duct section. The first duct section is constructed as a manifold or collecting duct and receives the heated exhaust air passing out of the air outlet ports of the modules.

Advantageously the collecting duct can be formed at least by the space downstream of the modules and which is generally used for cable running purposes. In the collecting duct the exhaust airflows of the individual modules are collected in a rising exhaust airflow with the aid of at least one ventilator, passed upwards, reversed and in the second duct section in a parallel, falling exhaust airflow are supplied to the air-water heat exchanger located in a lower cabinet area.

It is advantageous to be able to provide at least two or n+1 redundant, high power ventilators in the upper cabinet area in order to ensure the inventive air ducting of the closed cooling air circuit.

Appropriately the ventilators are juxtaposed and the falling duct section is split with the aid of a vertical separating element, e.g. a separating web into individual exhaust air duct sections, e.g. into a right-hand and left-hand exhaust air duct section. This prevents a return flow if one ventilator fails.

In a preferred construction, the ventilators and the second duct section for the falling exhaust airflow are integrated in a door, particularly in the rear door.

The arrangement of the supply air duct and exhaust air duct with the first and second duct sections takes place corresponding to the air ducting in the modules. Generally there is a front suction of the cooled supply air and a rear exhaust airflow of the heated exhaust air. Correspondingly the supply air duct is constructed at the front and the split exhaust air duct at the rear or with the ventilators and the second duct section in a rear door.

It falls within the scope of the invention to reverse the supply air duct and exhaust air duct or to place the same in the area of the side walls.

The air-technical separation of the cold supply air from the heated exhaust air, which contributes to obtaining the sought high power cooling, can advantageously be achieved with partitions, which are positioned between the modules and the cabinet walls and/or with blind plates in the front area of the modules. Then a supply of cold air solely to the modules and their horizontal gaps is ensured.

To maintain the air circulation and the control loop in the case of a fault, i.e. if all the modules fail, advantageously there is a planned interruption or "leak" particularly in the upper cabinet area.

Use can advantageously be made of a per se known air-water heat exchanger, which is correspondingly dimensioned and can e.g. extend over the entire width and/or depth of the cabinet. In order to be able to receive the exhaust air forced downwards in the second duct section to cool and to supply it as cooled supply air to the supply air duct, it is appropriate to construct the lower exhaust air openings of the second duct section in complementary manner to the inlet openings of the air-water heat exchanger and provide a corresponding sealing.

It is advantageous to place the air-water heat exchanger within the cabinet and can e.g. occupy the bottom six height units (HU). Then short cold water pipe paths are necessary for connection to the cold water supplying of the building. The lower arrangement is also advantageous with respect to the safety of the electronic modules and further electrical and electronic equipment and components in the case of any leak in the cold water system. Any water which flows out cannot reach the array of the electrical modules above the air-water heat exchanger, so that the necessary safety is ensured.

The air-water heat exchanger is appropriately designed in accordance with the necessary cooling capacity. In the case of a 20 kW cooling capacity, it is e.g. possible to provide as quantity flows 1 l/s cold water and 4000 m3/h circulated cooling air. It is also advantageous to design the advance and return of the cold water of the air-water heat exchanger in such a way that there is no drop below the dew point, so that condensate formation in the cabinet can be prevented.

Appropriately DC ventilators are provided in n+1 redundancy. If these ventilators are constructed in temperature-dependent, speed-controlled and alarm-monitored manner, by means of this control and software the temperature-speed characteristic can be adapted to the actual maximum power loss of the modules, e.g. servers.

A variable volume flow is used for adapting the heat dissipating power of the cabinet to the actual power loss of the modules or servers, which can vary as a function of the computing power and capacity utilization.

It is also appropriate to have equipment with a cabinet monitoring system to which can be inter alia connected a smoke detector, door contact switch, moisture sensor, water detector and speed control. With the aid of temperature sensors it is also possible to monitor the temperature of the supply air supplied to the modules, and on exceeding freely programmable desired values it is possible to trigger off different alarm stages (non-urgent, urgent) and automatically interrupt the AC power supply of the modules in the case of a thermal risk.

Appropriately in the case of an opening of the rear door the ventilators are automatically switched off. These return to operation when the rear door is closed.

Advantageously the cabinet is equipped with its own n+1 redundant DC power supply for the ventilators. By means of an AC distribution the socket boards are protected and switched for the AC supply of modules, particularly servers.

According to the method of the invention, the individual modules, which are juxtaposed and/or superimposed in a substantially airtight equipment and network cabinet and which are cooled with an airflow in closed circuit form, are supplied with cold supply air in equally long airflow paths and therefore identical flow resistances, as well as with a uniform supply air temperature, and the cold supply air is air-technically separated from the heated exhaust air.

Appropriately the air ducted in a supply air duct and exhaust air duct in the substantially airtight cabinet is circulated at a relatively high speed. For this purpose preferable n+1 redundant, high power ventilators are positioned in a clearly defined manner in a rising and falling exhaust airflow.

The airflow is cooled with the aid of an air-water heat exchanger located in a lower cabinet area. The supply airflow cooled in said air-water heat exchanger is supplied to the individual modules, e.g. through their air inlet ports, absorbs the heat loss produced in the modules and passes with the aid of the downstream ventilators into the exhaust air duct.

Appropriately the exhaust air duct has a split construction in order to implement the Tichlmann principle, i.e. identical flow paths and identical flow resistances. In a collecting duct the exhaust air of the individual modules is initially supplied in a rising exhaust air flow. Due to the fact that the exhaust air in said rising flow follows the thermal lift, advantageously an improved energy balance is obtained. Following a reversal of the rising exhaust airflow, the exhaust air is subject to a falling flow and supplied to the air-water heat exchanger in the lower cabinet area.

On grounds of the relatively high flow rate, the air ducting concept and the air separation of the supply/exhaust airflow, in conjunction with the lower air-water heat exchanger, an efficient cooling of the modules is brought about.

For the air-technical separation of the cold supply air and the heated exhaust air, advantageously in addition to the vertical separating elements between the juxtaposed and/or superimposed modules, blind plates are located at the positions left free.

In order to maintain an air circulation and the control loop, the air separation between the cold supply air and heated exhaust air is interrupted in planned manner and e.g. a free space is provided in an upper cabinet area.

The cooling system for network cabinets, particularly server cabinets according to the invention, with relatively low capital and operating expenditure permits high power cooling, particularly for cabinets in commercial data processing centres, e.g. in the banking and industrial sectors, but also in the scientific sector and in the case of computer clusters, which e.g. can have up to 100 cabinets, each of 10 kW. It is in particular possible to create in stepped manner water-cooled server cabinets up to e.g. 20 kW and higher cooling capacity in e.g. 2.5 kW steps and to ensure in said cabinets a uniform cooling air supply of all the servers, quite independently of the installation position within the cabinet. The installation of fans in the modules is not absolutely necessary, because the cooling concept according to the invention ensures uniform cooling of the individual modules even without fans.

An overheating and failure of the servers and the associated significant costs are avoided and high availability ensured.

A further advantage is the independence of the inventive cabinet cooling system from the ambient air. This enables a large number of cabinets to be installed in a room and fully assembled cabinets can be installed relatively close together, so that a significant room area saving can be achieved compared with conventional air conditioning. It is also advantageous that in data processing centres with conventional air conditioning, individual cabinets, which have a comparatively high heat loss, can be equipped with the cooling system according to the invention. The air conditioning can then be adapted in cost-saving manner to the lower heat loss of the remaining cabinets.

The invention is described in greater detail hereinafter relative to the attached highly diagrammatic drawings, wherein show:

FIG. 1 A longitudinal section through a network cabinet with a cooling system according to the invention.

Figure 2:
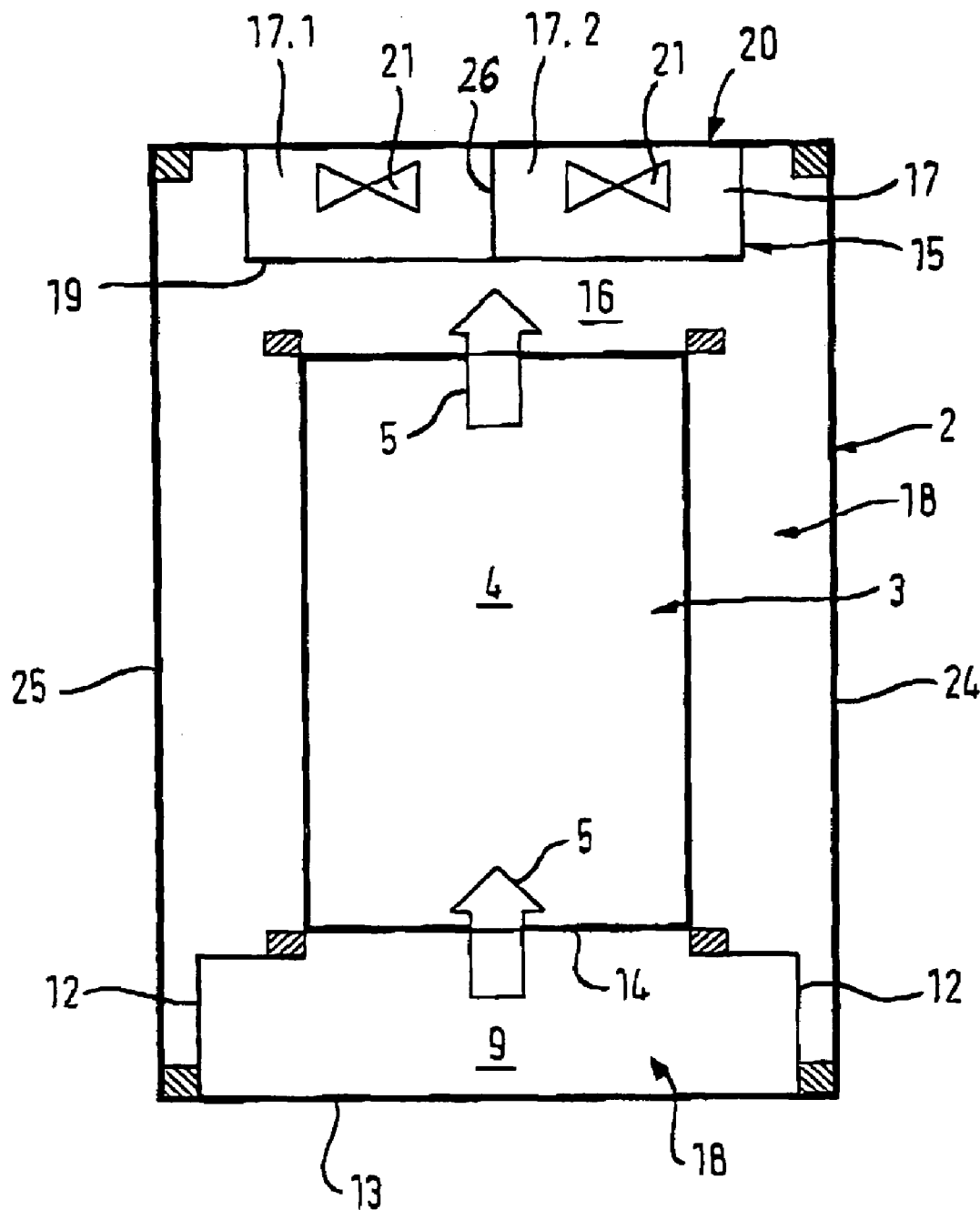

FIG. 2 A cross-section through the network cabinet according to FIG. 1.

FIG. 1 shows an equipment or network cabinet 2 with a virtually sealed inner space 18 and superimposed electronic modules 3. In this embodiment the equipment and network cabinet 2 is a server cabinet and the electronic modules 3 are e.g. servers 4 having e.g. one height unit (1 HU=44.45 mm=1.75 inch). The air ducting 5 in the area of the servers 4 is illustrated by arrows (FIG. 2). In this embodiment within the enclosure of the servers 4 is in each case provided a fan 6, which implements an air ducting 5, as follows: supply air 8 is sucked in via front air inlet ports (not shown), ducted around the heat loss-producing, electronic components (not shown) and supplied to an exhaust air duct 15 passing rear air outlet ports (not shown).

Below the servers 4 is provided an air-water heat exchanger 7, which is connected to the cold water supply of the building and which can e.g. require 6 HU. Thus, in the case of a server cabinet having 46 HU, 40 HU are available for the servers 4.

The air-water heat exchanger 7 can e.g. be operated with a cold water quantity of 1 l/s and a supply air temperature of approximately 12øC, so that exhaust air 10, 11 travelling in closed circuit form and heated to approximately 35øC can be cooled to approximately 20 to 25øC. The air cooled in the air-water heat exchanger 7 is supplied as supply air 8 to a supply air duct 9, which is connected to the not shown air inlet ports of the servers 4.

FIG. 2 shows the air-technical separation between the cold supply air 8 and the exhaust air in the exhaust air duct 15 heated in the servers 4. Air separation takes place in the front area of the network cabinet 2 with the aid of partitions 12, which are constructed as bent plates and positioned vertically. The supply air duct 9 is bounded by the partitions 12, a tightly closing front door 13 and the enclosure fronts 14 of the servers 4.

According to FIG. 1 all the existing HU of the cabinet 2 above the air-water heat exchanger 7 are occupied with servers 4, so that there is no need for blind plates for unoccupied HU.

The exhaust air 10, 11 passes into an exhaust air duct 15, which has a first duct section, constructed as a manifold or collecting duct 16, for a rising exhaust airflow 10 and a second duct section 17 for a falling exhaust airflow 11.

The second duct section 17 for the falling exhaust airflow 11 is constructed on a rear door 20, which is provided with an inside door cover 19 and also two ventilators 21 for the suction of the exhaust air 10. The ventilators 21 are juxtaposed at the same height in the upper area and the reversed exhaust air 11 is fed in a right and left-hand duct 17.1, 17.2 associated with each ventilator 21, by means of lower exhaust air openings 22, to the air-water heat exchanger 7.

FIG. 2 shows that the collecting duct 16 for the heated exhaust air 10 can be constructed not only behind the servers 4, but also laterally thereof in the vicinity of the side walls 24, 25 of the cabinet 2, if the air separation of supply air and exhaust air is advantageously carried out in the front area.

FIG. 1 illustrates the equally long airflow paths and equal flow resistances, independently of the installation height of the servers 4, as a result of the arrangement of the air-water heat exchanger 7 below the servers 4 and as a result of the air ducting, particularly in the rising and falling duct sections 16, 17 of the exhaust air duct 15. With the aid of the rising and falling exhaust air 10, 11 in the split exhaust air duct 15, the direct application of the heated exhaust air to the air-water heat exchanger 7 is prevented.

A small, planned interruption 23 of the air separation between the cold or cooled supply air 8 and the heated exhaust air 10 is created for maintaining the circulation of the airflow and therefore for maintaining the control loop, even in the case of a failure of the modules or servers. This planned interruption or "leak" 23 is provided in an upper area of the cabinet 2, particularly above the modules 3.

The invention claimed is:

1. A cooling system for an equipment and network cabinet, comprising:
   a sealed inner space of the cabinet,
   superimposed electronic modules located in the inner space, the individual electronic modules being supplied with cold supply air having a uniform supply air temperature and having air outlet ports for supplying heated exhaust air,
   a closed cooling air circuit for dissipating the heat loss of the electronic modules comprising a supply air duct and an exhaust air duct, the exhaust air duct having a first duct section for a rising exhaust airflow and a second duct section for a falling exhaust airflow,
   an air-water heat exchanger for cooling heated exhaust air, the air-water heat exchanger being located in a lower area of the cabinet, and
   an air ducting provided with equally long air flow paths and therefore equal flow resistances with respect to the individual electronic modules and an air-technical separation between the cold supply air and heated exhaust air,
   wherein the heated exhaust air is supplied through the air outlet ports of the electronic modules to the exhaust air duct.

2. The cooling system according to claim 1, wherein
the uniform supply air temperature is ensured by a relatively high flow rate independently of the installation position of the electronic modules.

3. The cooling system according to claim 2, wherein
the cold supply air in the supply air duct is supplied to the electronic modules through inlet ports therein.

4. The cooling system according to claim 2, wherein
the air-technical separation of the cold supply air and the heated exhaust air is brought about with the aid of partitions vertically arranged between the electronic modules and a cabinet covering part.

5. The cooling system according to claim 4, wherein the air-technical separation between the cold supply air and the heated exhaust air is brought about with the aid of blind plates provided on free places between electronic modules that are superimposed and juxtaposed.

6. The cooling system according to claim 4,
wherein
a planned interruption of the air separation between the cold supply air and heated exhaust air is provided in an upper area of the cabinet, for maintaining an air circulation and a control loop.

7. The cooling system according to claim 1,
wherein
the supply air duct and exhaust air duct are constructed so as to coincide with front air inlet ports and rear air outlet ports of the electronic modules.

8. The cooling system according to claim 7,
wherein
the supply air duct and exhaust air duct are formed virtually over the entire cabinet height.

9. The cooling system according to claim 1,
wherein
the first duct section for the rising exhaust air flow is constructed as a collecting duct for the heated exhaust air passing out of the individual electronic modules and is located downstream of the electronic modules in the area of cables runs.

10. The cooling system according to claim 9,
wherein
the exhaust air flow rising in the first duct section is guided upwards with the aid of at least one ventilator and following a reversal in the second duct section is supplied as the falling exhaust airflow to the air-water heat exchanger.

11. The cooling system according to claim 10,
wherein
two ventilators are provided in a rear door as well as in a right and left-hand duct section in which the falling exhaust air is guided downwards and supplied through exhaust air openings to the air-water heat exchanger.

12. The cooling system according to claim 11,
wherein
the right and left-hand duct sections are formed by an inside cover of the rear door and a vertical separating web.

13. The cooling system according to claim 12,
wherein
the inside door cover and the vertical separating web extend up to the air-water heat exchanger and have two lower exhaust air openings sealed with respect to the air-water heat exchanger.

14. The cooling system according to claim 11, wherein the ventilators in the exhaust air flow are temperature-dependent, speed-controlled and alarm-monitored and are adaptable to the actual power loss of the individual electronic modules.

15. The cooling system according to claim 14, wherein the cabinet is a server cabinet and the superimposed electronic modules are servers with a compact design of 1 HU.

16. The cooling system according to claim 1,
wherein
the air-water heat exchanger occupies the bottom height units of the cabinet and is dimensioned in accordance with the width and depth of the cabinet.

17. A method for a cooling equipment and network cabinet and superimposed electronic modules located therein, in which an airflow travels in closed circuit form, comprising the steps of:

cooling heated exhaust air in an air-water heat exchanger located in the lower cabinet area to a create cold supply air, supplying the cold supply air with a uniform air temperature in a rising supply airflow to the individual electronic modules in a long first airflow path, and removing the heated exhaust air in equally long airflow paths and therefore with equal flow resistances with respect to the individual electronic modules, removing the cold supply air from the individual electronic modules as heated exhaust air in a long second airflow path of equal length with the first airflow path and therefore with equal flow resistances with respect to the individual electronic modules, initially collecting the heated exhaust air from the electronic modules in a first exhaust air duct section, and subjecting the heated exhaust air in the first exhaust air duct section to a rising flow, then reversing the heated exhaust air and supplying it in a falling exhaust airflow to the air-water heat exchanger in the lower cabinet area, and air-technically separating the cold supply air from the heated exhaust air.

18. The method according to claim 17, wherein the cabinet is substantially airtight and the air is circulated at a relatively high speed added.

19. The method according to claim 17, wherein the circulated air is driven by at least one ventilator, which is located in the area of the reversed exhaust airflow.

20. The method according to claim 19, wherein the falling exhaust airflow is ducted in two parallel ducts and at least one ventilator is associated with each duct.

* * * * *